United States Patent
Nakano et al.

(10) Patent No.: US 10,322,526 B2
(45) Date of Patent: Jun. 18, 2019

(54) LASER PROCESSING METHOD

(75) Inventors: Makoto Nakano, Hamamatsu (JP);
Takashi Inoue, Hamamatsu (JP); Shinji Kohyama, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 829 days.

(21) Appl. No.: 13/511,664

(22) PCT Filed: Nov. 24, 2010

(86) PCT No.: PCT/JP2010/070915
§ 371 (c)(1),
(2), (4) Date: Jun. 4, 2012

(87) PCT Pub. No.: WO2011/065373
PCT Pub. Date: Jun. 3, 2011

(65) Prior Publication Data
US 2012/0234808 A1    Sep. 20, 2012

(30) Foreign Application Priority Data

Nov. 25, 2009 (JP) .................. P2009-267748

(51) Int. Cl.
*B23K 26/00* (2014.01)
*B23K 26/06* (2014.01)
(Continued)

(52) U.S. Cl.
CPC ........ *B28D 5/0011* (2013.01); *B23K 26/0006* (2013.01); *B23K 26/03* (2013.01);
(Continued)

(58) Field of Classification Search
CPC ............ B23K 2201/40; B23K 26/0057; B23K 26/03; B23K 26/032; B23K 26/04; B23K 26/00; B23K 26/045; B23K 26/06; B23K 26/0604; B23K 26/0608; B23K 26/0613; B23K 26/0717; B23K 26/0648;
(Continued)

(56) References Cited

U.S. PATENT DOCUMENTS 6,037,565 A    3/2000  Hackel et al.
2005/0281101 A1* 12/2005 Bruland ............ B23K 26/0613
                                                    365/200
2006/0289410 A1* 12/2006 Morita et al. ............ 219/121.67

FOREIGN PATENT DOCUMENTS

CN    1231225     10/1999
CN    101135856    3/2008
(Continued)

*Primary Examiner* — Michael G Hoang
(74) *Attorney, Agent, or Firm* — Drinker Biddle & Reath LLP

(57) ABSTRACT

Laser lights L1 to L3 are relatively moved along a line to cut 5, while repeating a converging step of simultaneously converging the laser lights L1 to L3 at converging positions P1 to P3 separated from each other along the line 5. This forms a plurality of modified spots S along the line 5 and causes the plurality of modified spots S to form a modified region 7. The converging positions P1 to P3 in the repeated converging steps are kept from being superposed on each other, while at least one of converging positions P21 to P23 in the converging step in a later stage is located between converging positions P11 to P13 in the converging step in an earlier stage.

6 Claims, 20 Drawing Sheets

(51) Int. Cl.
*B23K 26/067* (2006.01)
*B23K 26/53* (2014.01)
*B28D 5/00* (2006.01)
*B23K 26/03* (2006.01)
*B23K 26/08* (2014.01)
*B23K 26/0622* (2014.01)
*B23K 26/40* (2014.01)
*B23K 26/354* (2014.01)
*H01L 33/00* (2010.01)
*B23K 101/40* (2006.01)
*B23K 103/00* (2006.01)

(52) U.S. Cl.
CPC ...... *B23K 26/0622* (2015.10); *B23K 26/0676* (2013.01); *B23K 26/0853* (2013.01); *B23K 26/354* (2015.10); *B23K 26/40* (2013.01); *B23K 26/53* (2015.10); *B23K 2101/40* (2018.08); *B23K 2103/50* (2018.08); *B23K 2103/56* (2018.08); *H01L 33/0095* (2013.01)

(58) Field of Classification Search
CPC ............ B23K 26/0617; B23K 26/0676; B23K 26/0853; B23K 26/0006; B23K 26/0622; B23K 26/40; B23K 26/354; B23K 26/53; B23K 2101/40; B23K 2103/50; B23K 2103/56; B28D 5/0011; H01L 33/0095
USPC .............. 219/121.6, 121.67, 121.72, 121.73, 219/121.75, 121.76, 121.82, 121.77, 219/121.78, 121.79, 121.69
See application file for complete search history.

(56) References Cited

FOREIGN PATENT DOCUMENTS

| | | |
|---|---|---|
| JP | 2004-155159 | 6/2004 |
| JP | 2004-343008 | 12/2004 |
| JP | 2007-129225 | 5/2007 |
| JP | 2007-319882 | 12/2007 |
| JP | 2009-166103 | 7/2009 |
| KR | 10-2006-0126799 A | 12/2006 |
| TW | 200428729 | 12/2004 |
| TW | 200515966 | 5/2005 |
| TW | 200533451 | 10/2005 |
| TW | 200809942 | 2/2008 |

\* cited by examiner

Fig. 16

| SIMULTANEOUS CONVERGENCE NUMBER N \ SIMULTANEOUS CONVERGING POSITION INTERVAL H | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| 1 | | | | | | | | | | | | | | | | | | | | |
| 2 | | NG | | NG | | NG | | NG | | NG | | NG | | NG | | NG | | NG | | NG |
| 3 | | | NG | | | NG | | | NG | | | NG | | | NG | | | NG | | |
| 4 | | NG | | NG | | NG | | NG | | NG | | NG | | NG | | NG | | NG | | NG |
| 5 | | | | | NG | | | | | NG | | | | | NG | | | | | NG |
| 6 | | NG | NG | NG | | NG | | NG | NG | NG | | NG | | NG | NG | NG | | NG | | NG |
| 7 | | | | | | | NG | | | | | | | NG | | | | | | |
| 8 | | NG | | NG | | NG | | NG | | NG | | NG | | NG | | NG | | NG | | NG |
| 9 | | | NG | | | NG | | | NG | | | NG | | | NG | | | NG | | |
| 10 | | NG | | NG | NG | NG | | NG | | NG | | NG | | NG | NG | NG | | NG | | NG |

LASER PROCESSING METHOD

TECHNICAL FIELD

The present invention relates to a laser processing method for forming a modified region in an object to be processed.

BACKGROUND ART

Known as a conventional laser processing method is one irradiating an object to be processed with laser light while locating a converging position within the object, so as to form a modified region in the object along a line to cut (see, for example, Patent Literature 1).

CITATION LIST

Patent Literature

Patent Literature 1: Japanese Patent Application Laid-Open No. 2004-343008

SUMMARY OF INVENTION

Technical Problem

It has strongly been desired for the above-mentioned laser processing method to further shorten takt time in laser processing in order to lower the running cost and so forth. In addition, it has been demanded for the above-mentioned laser processing method to form the modified region accurately in order to improve the processing quality and so forth; for example, there is a case where modified spots are demanded to be formed densely (closely to each other) along the line to cut.

It is therefore an object of the present invention to provide a laser processing method which can shorten the takt time in laser processing and accurately form the modified region.

Solution to Problem

For achieving the above-mentioned object, the laser processing method in accordance with the present invention is a laser processing method for converging a plurality of laser lights at an object to be processed so as to form a modified region in the object along a line to cut, the method comprising a converging step of simultaneously converging a plurality of laser lights at a plurality of converging positions separated from each other along the line to cut and a forming step of relatively moving the plurality of laser lights along the line to cut while repeating the converging step, so as to form a plurality of modified spots along the line to cut and cause the plurality of modified spots to form the modified region; wherein the plurality of converging positions in the repeated converging steps are kept from being superposed on each other; and wherein at least one of the plurality of converging positions in the converging step in a later stage is located between the plurality of converging positions in the converging step in an earlier stage.

The laser processing method in accordance with the present invention can form a modified region by simultaneously converging a plurality of laser lights at a plurality of converging positions separated from each other along a line to cut and thus can shorten the takt time. In addition, since at least one of the plurality of converging positions in the converging step in a later stage is located between the plurality of converging positions in the converging step in an earlier stage, modified spots can finally be formed densely in the object along the line to cut. At this time, the plurality of converging positions in the repeated converging steps are not superposed on each other, so that irradiation of existing modified spots with laser light (so-called overstriking with laser light) can be prevented from occurring, which can avoid idleness in the takt time and inhibit the modified spots from becoming uselessly large and adversely affecting the forming of the modified region. Therefore, the present invention can shorten the takt time in laser processing and form the modified region accurately.

In the case where at least one of the plurality of converging positions in the converging step in the later stage is thus located between the plurality of converging positions in the converging step in the earlier stage, the modified region can also be formed accurately when the plurality of laser lights to be simultaneously converged in the converging step are separated from each other so as to be kept from being superposed on each other on at least one of a laser light irradiation surface of the object and a surface of the object opposite therefrom. This can inhibit the plurality of laser lights from being superposed on each other in the object and thereby enhancing the beam intensity and thus can prevent the object from deteriorating. Here, "the plurality of laser lights are kept from being superposed on each other" means that the plurality of laser lights are not substantially superposed on each other. That is, even when a plurality of laser lights are partly superposed on each other, the plurality of laser lights are not meant to be substantially superposed on each other if the energy density of the superposed laser light is not higher than a predetermined intensity which deteriorates the object.

Preferably, at least one of the plurality of converging positions in the later converging step is located between the plurality of converging positions in the converging step in the earlier stage so that the plurality of modified spots are formed equidistantly along the line to cut. This can form the plurality of modified spots equidistantly along the line to cut, whereby the object can be cut accurately along the line to cut.

Here, the plurality of converging positions in the converging step may have the same interval H, the interval H being a product of an interval between the plurality of modified spots and a predetermined number other than an integral multiple of a divisor (other than 1) of the number N of the plurality of converging positions. This can favorably yield the above-mentioned operational effect of keeping the plurality of converging positions in the repeated converging steps from being superposed on each other and the above-mentioned operational effect of equidistantly forming the plurality of modified spots in the object along the line to cut.

Preferably, in the forming step, the plurality of laser lights are relatively moved from outside to inside or from inside to outside of the object in a direction along the line to cut while repeating the converging step. When relatively moving a plurality of laser lights while repeating the converging step, as illustrated in FIG. 15, for example, final converging positions P are hard to place equidistantly on the converging step start side 401 and converging step end side 402 even by repeating the converging step. By contrast, when laser lights L1 to L3 are relatively moved from outside to inside or from inside to outside of an object to be processed 1 as mentioned above, the converging positions P on the converging step start side R1 or converging step end side R2 can be placed on the outside of the object 1, whereby only the equidistantly arranged plurality of converging positions P can be placed in the object 1. Hence, a plurality of modified spots S can be formed equidistantly from one end to the other end of the object 1 along a line to cut 5.

Advantageous Effects of Invention

The present invention can shorten the takt time in laser processing and form the modified region accurately.

BRIEF DESCRIPTION OF DRAWINGS

FIG. 16 is a chart illustrating the relationship between the number of simultaneous convergences and the interval between simultaneous converging positions;

FIG. 18 is a diagram illustrating simultaneous converging positions and orders of convergences in an embodiment in accordance with another example;

FIG. 19 is a diagram illustrating simultaneous converging positions and orders of convergences in an embodiment in accordance with still another example; and FIG. 20 is a diagram illustrating simultaneous converging positions and orders of convergences in an embodiment in accordance with yet another example.

DESCRIPTION OF EMBODIMENTS

Figure 1:
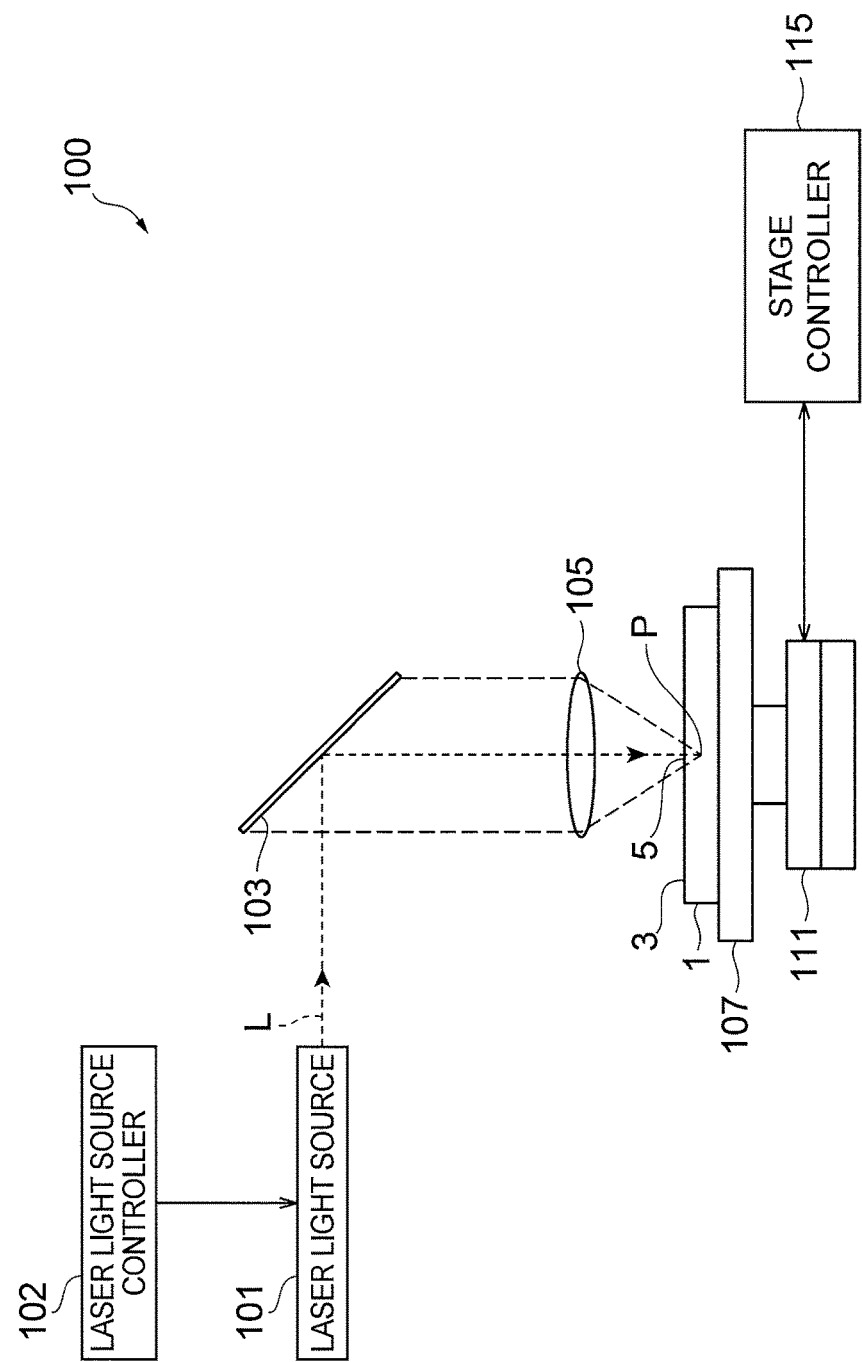
FIG. 1 is a schematic structural diagram of a laser processing apparatus for forming a modified region.

In the following, preferred embodiments of the present invention will be explained in detail with reference to the drawings. In the drawings, the same or equivalent constituents will be referred to with the same signs while omitting their overlapping descriptions.

The laser processing apparatus and method in accordance with the embodiments converge a plurality of pulsed laser lights simultaneously at an object to be processed, so as to form a plurality of modified spots within the object along a line to cut and cause the plurality of modified spots to form a modified region to become a cutting start point. Therefore, the forming of the modified region will firstly be explained with reference to FIGS. 1 to 6.

As illustrated in FIG. 1, a laser processing apparatus 100 comprises a laser light source 101 for causing laser light L to oscillate in a pulsating manner, a dichroic mirror 103 arranged such as to change the direction of the optical axis (optical path) of the laser light L by 90°, and a condenser lens 105 for converging the laser light L. The laser processing apparatus 100 also comprises a support table 107 for supporting an object to be processed 1 which is irradiated with the laser light L converged by the condenser lens 105, a stage 111 for moving the support table 107, a laser light source controller 102 for regulating the laser light source 101 in order to adjust the output, pulse width, and the like of the laser light L, and a stage controller 115 for regulating movements of the stage 111.

In the laser processing apparatus 100, the laser light L emitted from the laser light source 101 changes the direction of its optical axis by 90° with the dichroic mirror 103 and then is converged by the condenser lens 105 into the object 1 mounted on the support table 107. At the same time, the stage 111 is shifted, so that the object 1 moves relative to the laser light L along a line to cut 5. This forms a modified region in the object 1 along the line 5.

Figure 2:
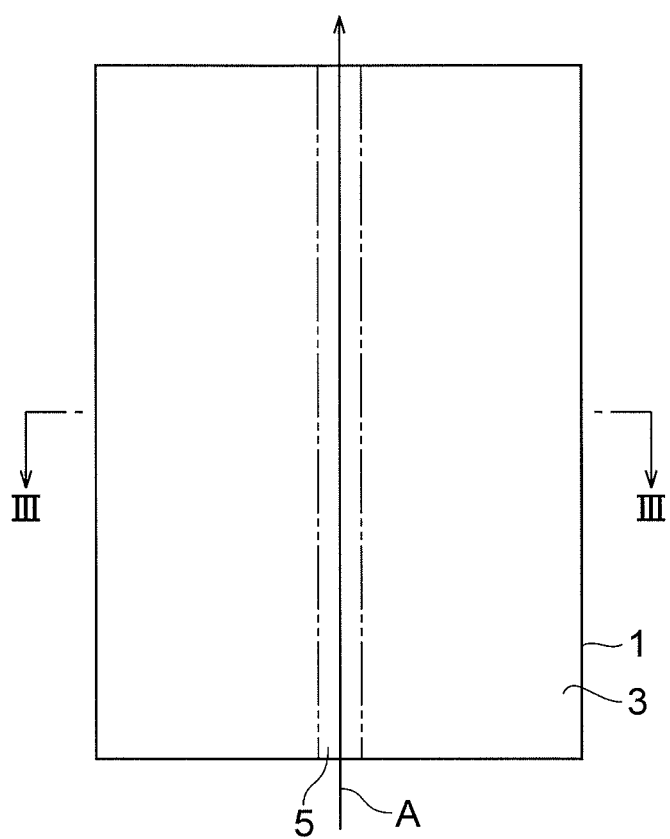
FIG. 2 is a plan view of an example of objects to be processed for which the modified region is formed.
Figure 3:
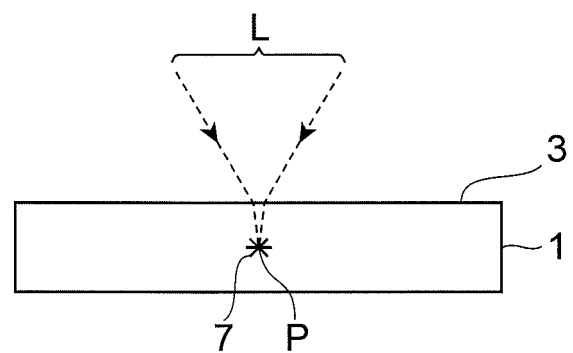
FIG. 3 is a sectional view of the object taken along the line III-III of FIG. 2.
Figure 4:
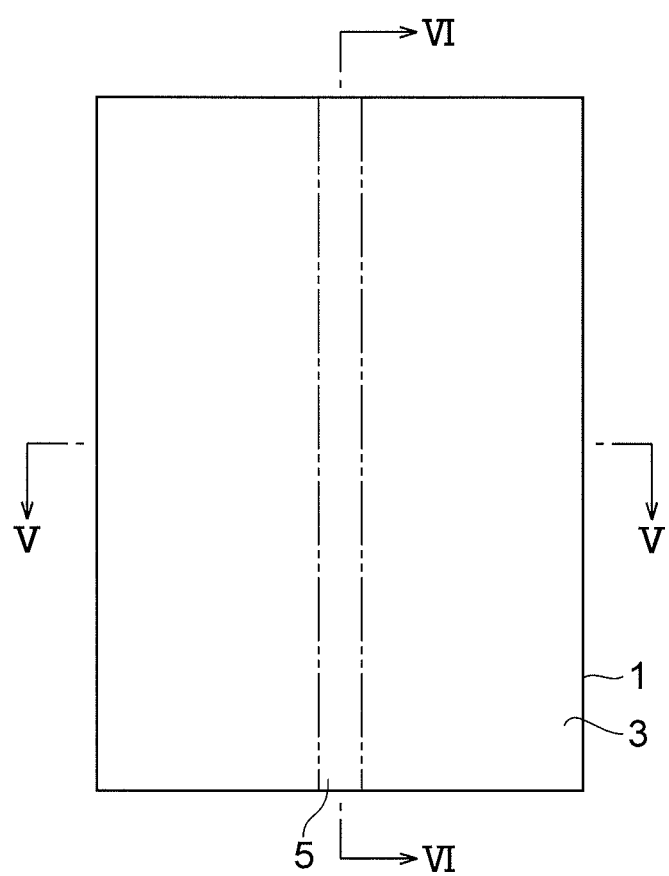
FIG. 4 is a plan view of the object after laser processing.
Figure 5:
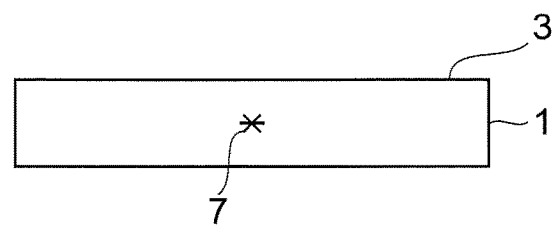
FIG. 5 is a sectional view of the object taken along the line V-V of FIG. 4.
Figure 6:
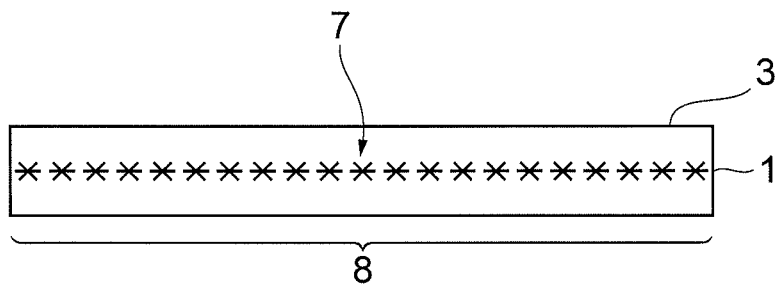
FIG. 6 is a sectional view of the object taken along the line VI-VI of FIG. 4.

A semiconductor material, a piezoelectric material, or the like is used for the object 1, in which the line 5 for cutting the object 1 is set as illustrated in FIG. 2. The line 5 is a virtual line extending straight. When forming a modified region within the object 1, the laser light L is relatively moved along the line 5 (i.e., in the direction of arrow A in FIG. 2) while locating a converging point (converging position) P within the object 1 as illustrated in FIG. 3. This forms a modified region 7 within the object 1 along the line 5 as illustrated in FIGS. 4 to 6, whereby the modified region 7 formed along the line 5 becomes a cutting start region 8.

The converging point P is a position at which the laser light L is converged. The line 5 may be curved instead of being straight and may be a line actually drawn on the front face 3 of the object 1 without being restricted to the virtual line. The modified region 7 may be formed either continuously or intermittently. The modified region 7 may also be either in rows or dots and is only required to be formed at least partly within the object 1. There are cases where fractures are formed from the modified region 7 acting as a start point, and the fractures and modified region 7 may be exposed at outer surfaces (the front face, rear face, and outer peripheral face) of the object 1.

Here, the laser light L is absorbed in particular in the vicinity of the converging point within the object 1 while being transmitted therethrough, whereby the modified region 7 is formed in the object 1 (internal absorption type laser processing). Therefore, the front face 3 of the object 1 hardly absorbs the laser light L and thus does not melt. In the case of forming a removing part such as a hole or groove by melting it away from the front face 3 (surface absorption type laser processing), the processing region gradually progresses from the front face 3 side to the rear face side in general.

The modified region formed by the laser processing apparatus in accordance with this embodiment means regions whose physical characteristics such as density, refractive index, and mechanical strength have attained states different from those of their surroundings. Examples of the modified region include molten processed regions, crack regions, dielectric breakdown regions, refractive index changed regions, and their mixed regions. Further examples of the modified region include an area where the density of the modified region has changed from that of an unmodified region in the material of the object and an area formed with a lattice defect (which can collectively be referred to as a high-density transitional region).

The molten processed regions, refractive index changed regions, areas where the modified region has a density different from that of the unmodified region, and areas formed with a lattice defect may further incorporate a fracture (cut or microcrack) therewithin or at an interface between the modified and unmodified regions. The incorporated fracture may be formed over the whole surface of the modified region or in only a part or a plurality of parts thereof. Examples of the object 1 include those containing or constituted by any of silicon, glass, $LiTaO_3$, and sapphire ($Al_2O_3$).

This embodiment produces the modified region 7 by forming a plurality of modified spots (processing scars) along the line 5. The modified spots, each of which is a modified part formed by a shot of one pulse of pulsed laser light (i.e., one pulse of laser irradiation; laser shot), gather to yield the modified region 7. Examples of the modified spots include crack spots, molten processed spots, refractive index changed spots, and those in which at least one of them is mixed.

Preferably, for the modified spots, their sizes and lengths of fractures generated therefrom are controlled as appropriate in view of the required cutting accuracy, the demanded flatness of cut surfaces, the thickness, kind, and crystal orientation of the object, and the like.

Figure 7:
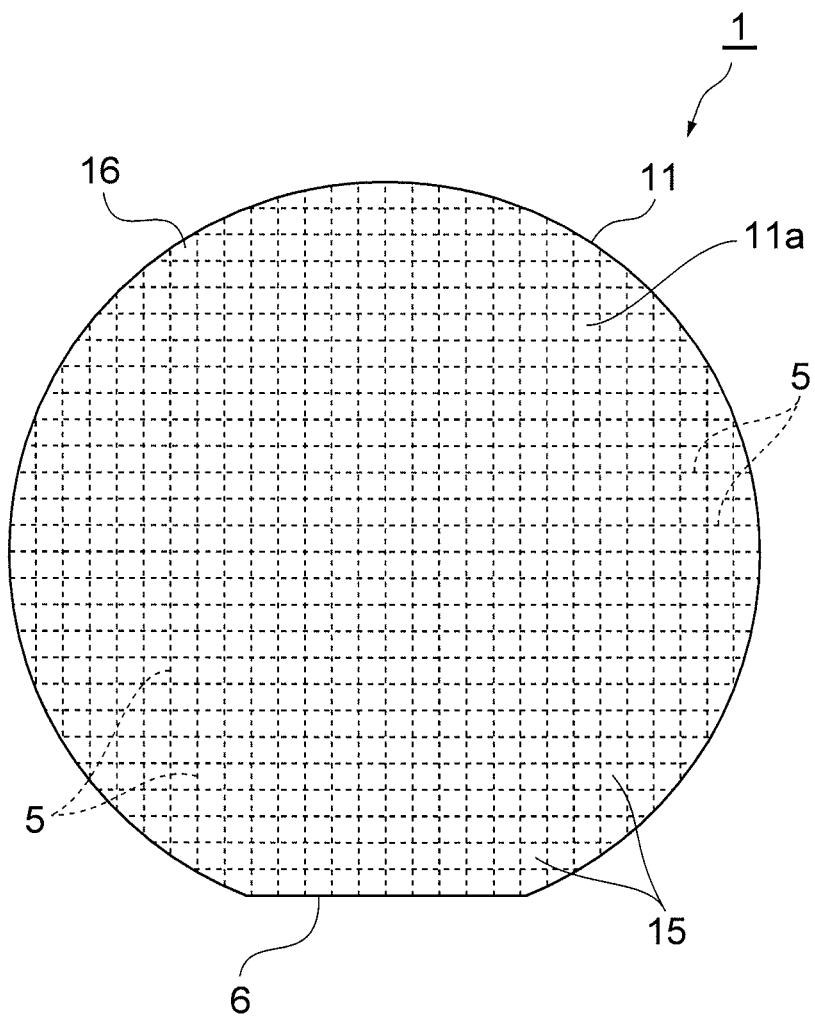
FIG. 7 is a plan view illustrating the object.

An embodiment in accordance with the present invention will now be explained in detail. FIG. 7 is a plan view illustrating an object to be processed which is subjected to the laser processing method in accordance with this embodiment. As illustrated in FIG. 7, the object 1 comprises a sapphire substrate 11, a GaN (gallium nitride) layer 16 formed on a front face 11a of the sapphire substrate 11 with a buffer layer interposed therebetween, and a functional device layer (not depicted) formed on the GaN layer 16 while containing a plurality of functional devices 15.

A number of functional devices 15, examples of which include semiconductor operating layers formed by crystal growth, light-receiving devices such as photodiodes, light-emitting devices such as laser diodes, and circuit devices formed as integrated circuits, are arranged in a matrix in directions parallel and perpendicular to an orientation flat 6 of the sapphire substrate 11. Thus constructed object 1 is cut along lines to cut 5 set like lattices passing between the functional devices adjacent to each other.

Figure 8:
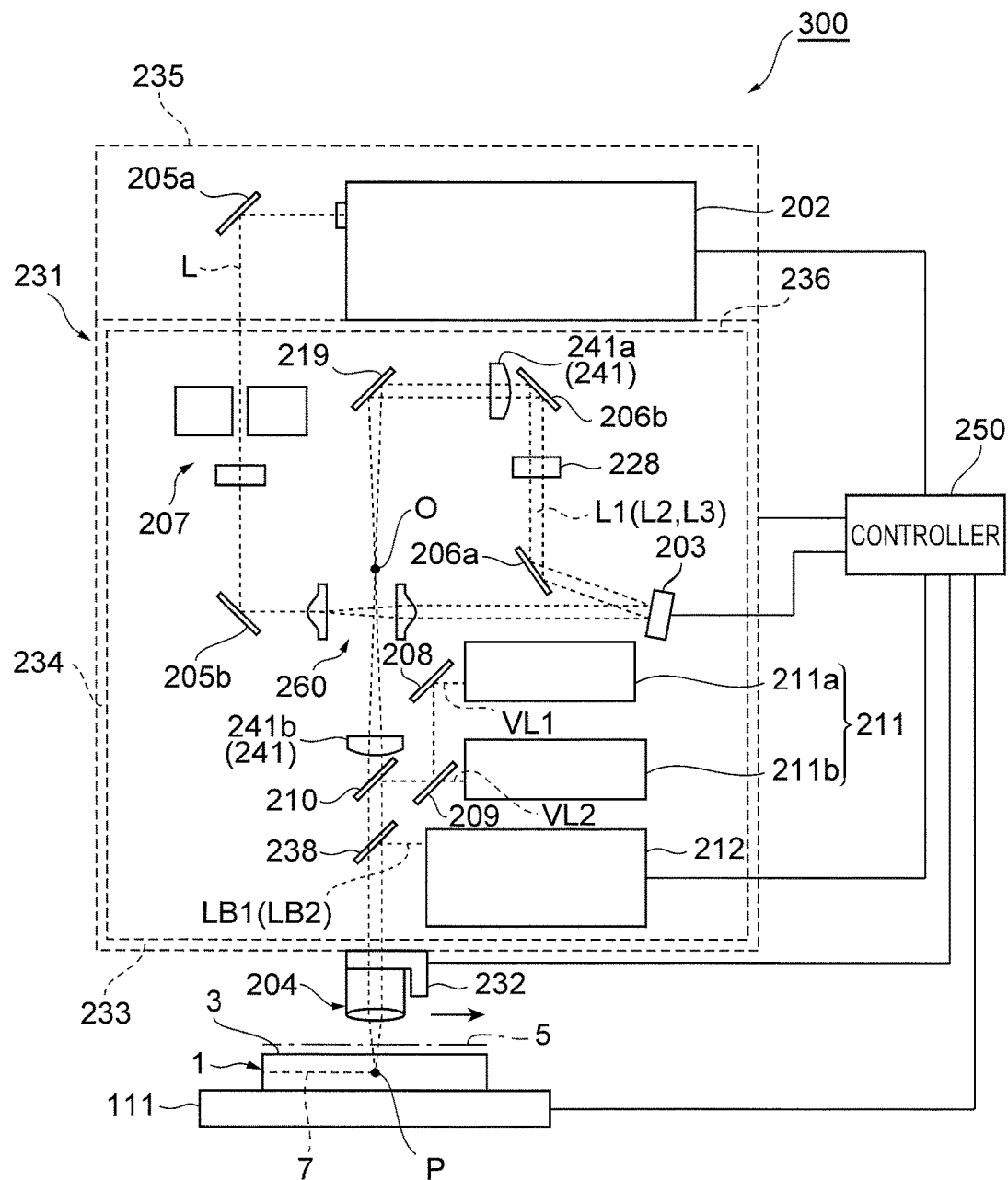
FIG. 8 is a schematic structural diagram of a laser processing apparatus for performing the laser processing method in accordance with an embodiment.

FIG. 8 is a schematic structural diagram illustrating a laser processing apparatus for performing the laser processing method in accordance with the embodiment of the present invention. As illustrated in FIG. 8, this laser processing apparatus 300 comprises a laser light source 202, a reflective spatial light modulator 203, a 4f optical system 241, and a condenser optical system 204 which are accommodated in a housing 231.

The laser light source 202, for which a fiber laser is used, for example, emits laser light L which is pulsed laser light having a wavelength of 532 nm, for example. Here, the laser light source 202 is secured to a top plate 236 of the housing 231 with screws or the like so as to emit laser light horizontally.

The reflective spatial light modulator 203, for which a spatial light modulator (SLM) made of a liquid crystal on silicon (LCOS) is used, for example, modulates the laser light L emitted from the laser light source 202. Here, the reflective spatial light modulator 203 modulates the pulsed laser light L horizontally incident thereon, while reflecting it obliquely upward with respect to the horizontal direction, so as to converge the pulsed laser light simultaneously at a plurality of converging positions (simultaneous convergence) separated from each other in a direction along the line to cut 5 in which the pulsed laser light L is relatively moved.

Figure 9:
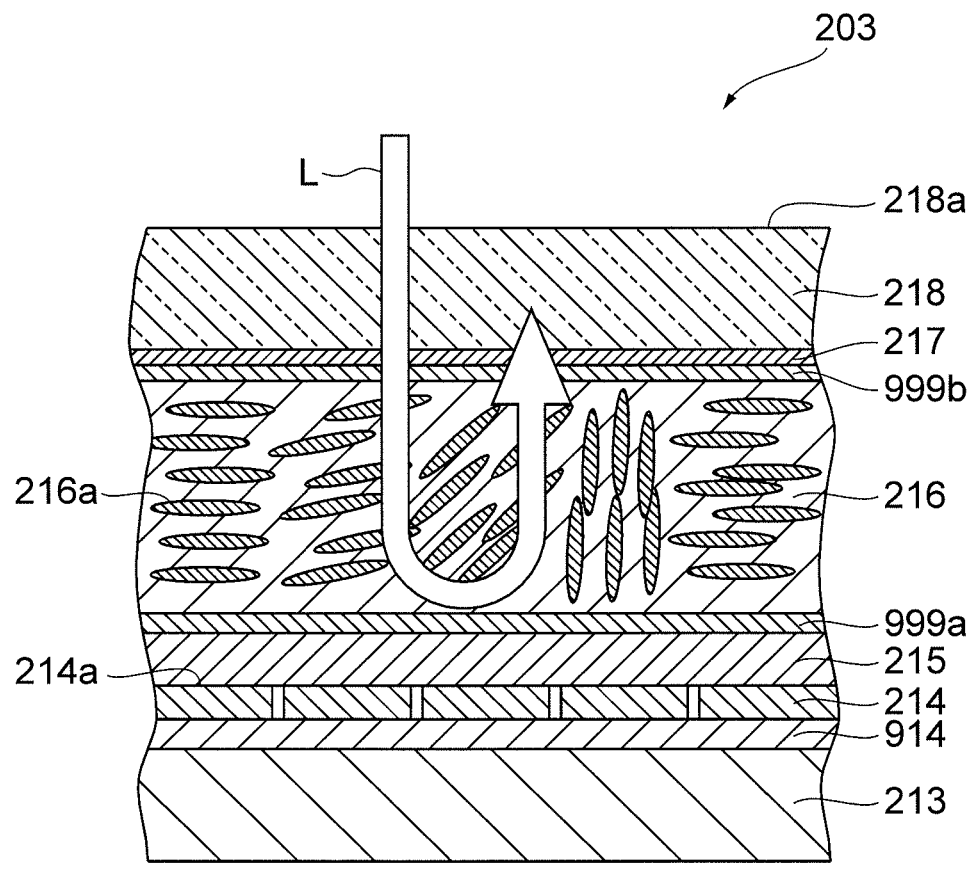
FIG. 9 is a partial sectional view of a reflective spatial light modulator.

FIG. 9 is a partial sectional view of the reflective spatial light modulator in the laser processing apparatus of FIG. 8. As illustrated in FIG. 9, the reflective spatial light modulator 203 comprises a silicon substrate 213, a drive circuit layer 914, a plurality of pixel electrodes 214, a reflecting film 215 such as a dielectric multilayer film mirror, an alignment film 999a, a liquid crystal film 216, an alignment film 999b, a transparent conductive film 217, and a transparent substrate 218 such as a glass substrate, which are stacked in this order.

The transparent substrate 218 has a front face 218a extending along an XY plane, while the front face 218a constitutes a front face of the reflective spatial light modulator 203. The transparent substrate 218 is mainly composed of a light-transmitting material such as glass, for example, and transmits therethrough the laser light L having a predetermined wavelength incident thereon from the front face 218a of the reflective spatial light modulator 203 to the inside of the latter. The transparent conductive film 217 is formed on the rear face of the transparent substrate 218 and mainly composed of a conductive material (e.g., ITO) which transmits therethrough the laser light L.

The plurality of pixel electrodes 214 are arranged two-dimensionally according to the arrangement of a plurality of pixels on the silicon substrate 213 along the transparent conductive film 217. Each pixel electrode 214 is made of a metal material such as aluminum, for example, while its front face 214a is processed flat and smooth. The plurality of pixel electrodes 214 are driven by an active matrix circuit provided with the drive circuit layer 914.

The active matrix circuit is disposed between the plurality of pixel electrodes 214 and the silicon substrate 213 and controls the voltage applied to the pixel electrodes 214 according to a light image to be issued from the reflective spatial light modulator 203. An example of such an active matrix circuit has a first driver circuit for controlling pixel rows each aligning in the X direction and a second driver circuit for controlling pixel columns each aligning in the Y direction, which are not depicted, and is constructed such that the controller 250 applies a predetermined voltage to the pixel electrode 214 of a pixel designated by both of the driver circuits.

The alignment films 999a, 999b are arranged on both faces of the liquid crystal layer 216, so as to align a group of liquid crystal molecules in a fixed direction. As the alignment films 999a, 999b, those made of a polymer material such as polyimide, whose surfaces coming into contact with the liquid crystal layer 216 have been subjected to rubbing, for example, are employed.

The liquid crystal layer 216 is arranged between the plurality of pixel electrodes 214 and the transparent conductive film 217 and modulates the laser light L according to an electric field formed between each pixel electrode 214 and the transparent conductive film 217. That is, when the active matrix circuit applies a voltage to a certain pixel electrode 214, an electric field is formed between the transparent conductive film 217 and this pixel electrode 214.

The electric field is applied to the reflecting film 215 and the liquid crystal layer 216 at a ratio of their respective thicknesses. The alignment direction of liquid crystal molecules 216a changes according to the magnitude of the electric field applied to the liquid crystal layer 216. The laser light L entering the liquid crystal layer 216 through the transparent substrate 218 and transparent conductive film 217, if any, is modulated by the liquid crystal molecules 216a while passing through the liquid crystal layer 216, then reflected by the reflecting film 215, and thereafter modulated again by the liquid crystal layer 216 before being taken out.

Figure 10:
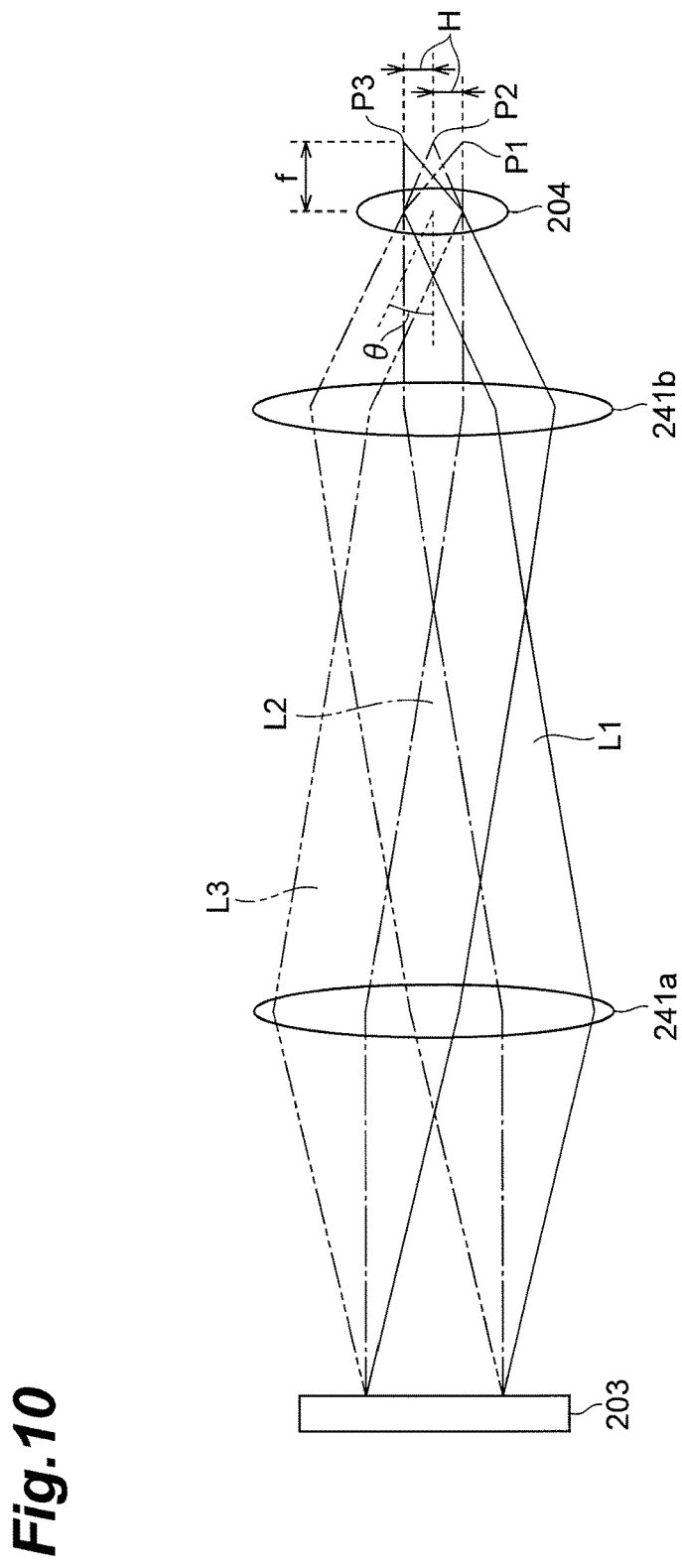
FIG. 10 is a schematic view illustrating a main part of an optical system in the laser processing apparatus of FIG. 8.

This adjusts the wavefront of the laser light L incident on and transmitted through a modulation pattern, so that individual rays constituting the laser light L vary in their phases of components in a predetermined direction orthogonal to their advancing direction. Resultantly, as illustrated in FIG. 10, the laser light L is modulated so as to be converged through the condenser optical system 204 to multiple points at a plurality of given positions in three-dimensional directions within the object 1. Specifically, the condenser optical system 204 adjusts the intensity, amplitude, phase, polarization, and the like of the laser light L, so as to doubly refract it, whereby the laser light is simultaneously converged at a plurality of converging positions separated from each other along the line to cut 5 within the object 1.

Returning to FIG. 8, the 4f optical system 241 adjusts the wavefront form of the laser light L modulated by the reflective spatial light modulator 203. The 4f optical system 241 has first and second lenses 241a, 241b.

The lenses 241a, 242b are arranged between the reflective spatial light modulator 203 and the condenser optical system 204 such that the distance between the reflective spatial light modulator 203 and the first lens 241a equals the focal length f1 of the first lens 241a, the distance between the condenser optical system 204 and the second lens 241b equals the focal length f2 of the lens 241b, the distance between the first and second lenses 241a, 241b equals f1+f2, and the first and second lenses 241a, 241b constitute a double-telecentric optical system. This 4f optical system 241 can inhibit the laser light L modulated by the reflective spatial light modulator 203 from changing its wavefront form through spatial propagation and thereby increasing aberration.

The condenser optical system 204 converges the laser light L modulated by the 4f optical system 241 into the object 1. The condenser optical system 204, which includes a plurality of lenses, is placed on a bottom plate 233 of the housing 231 while interposing therebetween a drive unit 232 composed of a piezoelectric device and the like.

The laser processing apparatus 300 also comprises a surface observation unit 211 for observing the front face 3 of the object 1 and an AF (AutoFocus) unit 212 for finely adjusting the distance between the condenser optical system 204 and the object 1, which are accommodated in the housing 231.

The surface observation unit 211 has an observation light source 211a for emitting visible light VL1 and a detector 211b for receiving and detecting reflected light VL2 of the visible light VL1 reflected by the front face 3 of the object 1. In the surface observation unit 211, the visible light VL1 emitted from the observation light source 211a is reflected by a mirror 208 and dichroic mirrors 209, 210 and transmitted through a dichroic mirror 238, so as to be converged by the condenser optical system 204 to the object. The reflected light VL2 reflected by the front face 3 of the object 1 is converged by the condenser optical system 204, so as to be transmitted through and reflected by the dichroic mirrors 238, 210, respectively, and then transmitted through the dichroic mirror 209, so as to be received by the detector 211b.

The AF unit 212 emits AF laser light LB1 and receives and detects reflected light LB2 of the AF laser light LB1 reflected by the front face 3 of the object 1, thereby acquiring displacement data of the front face 3 along the line to cut 5. Then, when forming the modified region 7, the AF unit 212 drives the drive unit 232 according to thus obtained displacement data, so as to move the condenser optical system 204 to-and-fro in its optical axis along undulations of the front face 3 of the object 1.

The laser processing apparatus 300 further comprises a controller 250, constituted by CPU, ROM, RAM, and the like, for controlling the laser processing apparatus 300. The controller 250 controls the laser light source 202, so as to adjust the output, pulse width, and the like of the laser light L emitted from the laser light source 202. When forming the modified region 7, the controller 250 controls the positions of the housing 231 and stage 111 and the driving of the drive unit 232 so that the simultaneous converging positions of the laser light L are located at a predetermined distance from the front face 3 of the object 1 and relatively move along the line to cut 5.

When forming the modified region 7, the controller 250 also applies a predetermined voltage to each of electrode units 214a, 217a in the reflective spatial light modulator 203, so as to cause the liquid crystal layer 216 to display a predetermined modulation pattern. This allows the laser light L to be modulated desirably by the reflective spatial light modulator 203 and converged simultaneously at a plurality of given simultaneous converging positions in three-dimensional directions within the object 1, so as to form at least a plurality of modified spots S separated from each other along the line to cut 5 at the same time (as will be explained later in detail).

The predetermined modulation pattern has been derived beforehand from the position to form the modified region 7, the wavelength of the laser light L to be emitted, the refractive indexes and the like of the condenser optical system 204 and object 1, for example, and is stored in the controller 250.

A case where the object 1 is processed by the above-mentioned laser processing apparatus 300 will now be explained. Here, a case where the laser light L is simultaneously converged at three simultaneous converging positions separated from each other along the line to cut 5 will be explained as an example.

First, an expandable tape, for example, is attached to the front face 3 of the object 1, and the object 1 is mounted on the stage 111. Subsequently, while irradiating the object 1 with the laser light L in a pulsating manner from the rear face 21 employed as the laser light irradiation surface, the object 1 is moved relative to (scanned with) the laser light L along the line to cut 5, so as to form the modified region 7.

Specifically, the laser light L emitted from the laser light source 202 advances horizontally within the housing 231 and then is reflected downward by a mirror 205a, whereby its light intensity is adjusted by an attenuator 207. Thereafter, the laser light L is horizontally reflected by a mirror 205b and, with its intensity distribution homogenized by a beam homogenizer 260, enters the reflective spatial light modulator 203.

The laser light L incident on the reflective spatial light modulator 203 is transmitted through and modulated according to the modulation pattern displayed on the liquid crystal layer 216 and then is emitted as laser lights L1 to L3 obliquely upward with respect to the horizontal direction. Subsequently, they are reflected upward by a mirror 206a and then, after their polarization direction is changed by a half-wave plate 228 so as to orient along the line to cut 5, horizontally by a mirror 206b, so as to enter the 4f optical system 241.

Subsequently, the wavefront forms of the laser lights L1 to L3 are adjusted so that they enter the condenser optical system 204 as parallel light. Specifically, they are transmitted through and converged by the first lens 241a, reflected downward by a mirror 219, diverged through a confocal point O, and transmitted through the second lens 241b, so as to be converged again to become parallel light. The laser lights L1 to L3 pass through the dichroic mirrors 210, 238 in sequence, so as to enter the condenser optical system 204, which simultaneously converges them into the object 1 mounted on the stage 111. As a result, three modified spots S (see FIG. 11) arranged at equally spaced intervals at a predetermined depth in the thickness direction are simultaneously formed within the object 1.

The three-point simultaneous convergence of laser lights L1 to L3 mentioned above is repeated along the line to cut 5, so as to form a plurality of modified spots S within the object 1, which produce the modified region 7. Thereafter, the expandable tape is expanded, so as to cut the object 1 along the line 5 from the modified region 7 acting as a cutting start point, whereby the object 1 is separated into a plurality of chips (e.g., memories, ICs, light-emitting devices, and light-receiving devices).

As mentioned above, this embodiment relatively moves the laser lights L1 to L3 along the line to cut 5, while repeating the step of simultaneously converging the laser lights L1 to L3 at simultaneous converging positions which are a plurality of converging positions for simultaneous convergence (also simply referred to as "converging step" hereinafter). This will be explained in detail in the following with reference to FIGS. 10 to 14.

First, the controller 250 is controlled according to the interval B (see FIG. 15) between a plurality of modified spots S to be formed finally in the object 1 and the repetition frequency of the laser light L, so as to set a scan speed. Then, the reflective spatial light modulator 203 is controlled, so as to set the simultaneous convergence number N(N=3 here) as the number of simultaneous convergences, and the angle of incidence of the condenser optical system 204 is controlled, so as to set the interval H (see FIG. 15) between the simultaneous converging positions P1 to P3. That is, the reflective spatial light modulator 203 is controlled so as to perform desirable wide-interval simultaneous laser processing.

Figure 15:
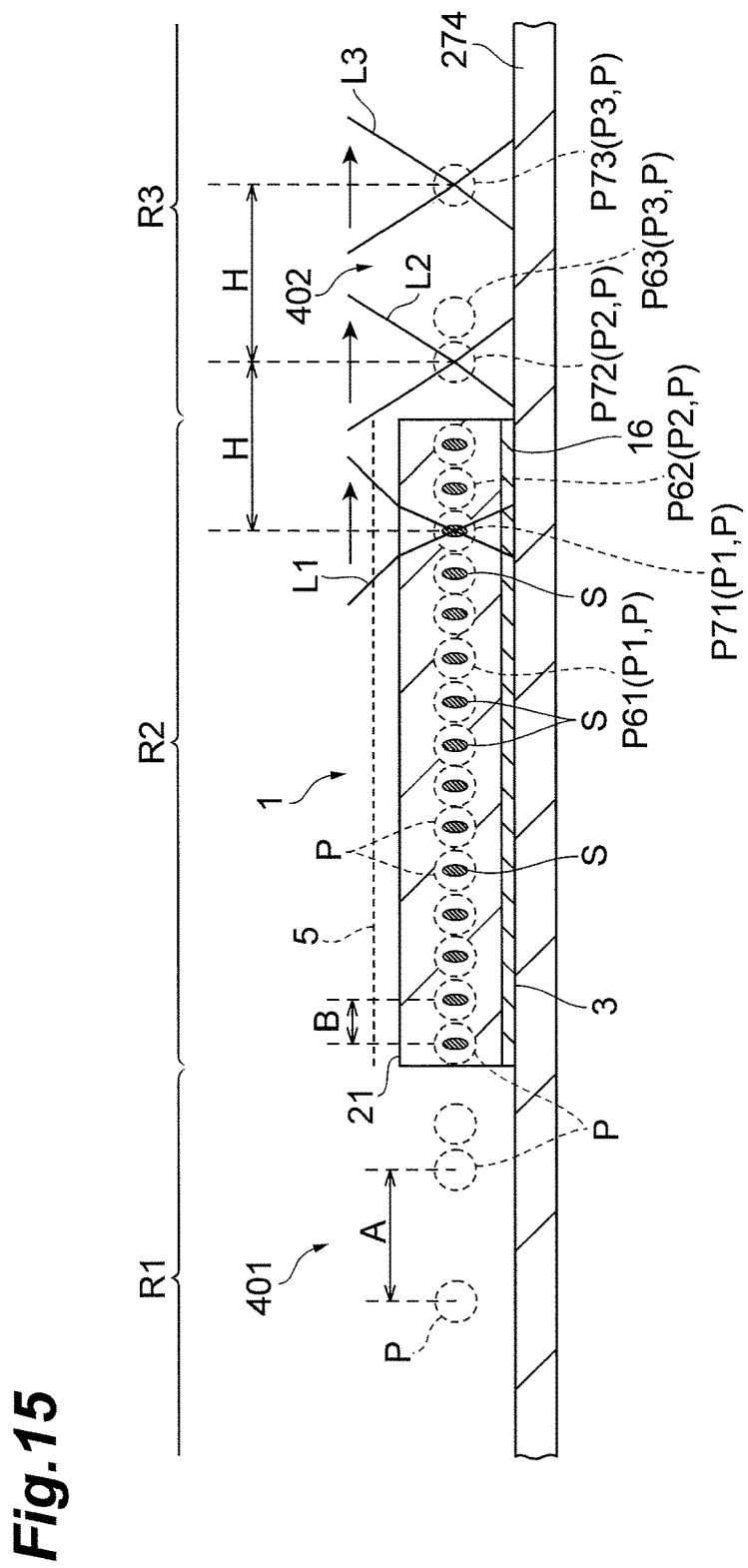
FIG. 15 is a process drawing illustrating a sequel to FIG. 14(b)

Here, while using a predetermined diffraction grating pattern as a modulation pattern of the condenser optical system 204, so as to set the simultaneous convergence number N, the magnitude of its grating width is controlled, so as to set the interval H between the simultaneous converging positions P1 to P3. As illustrated in FIG. 15, the interval H can also be regarded as the interval between the converging positions P, P adjacent to each other among a plurality of converging positions P at which the laser lights L1 to L3 finally converge in a plurality of repeated converging steps.

FIG. 10 is a schematic view illustrating a main part of the optical system in the laser processing apparatus of FIG. 8. As illustrated in FIG. 10, the interval H is set by the focal length f of the condenser optical system 204 and the angle of incidence θ of the laser lights L1 to L3 onto the condenser optical system 204 and is determined by H=f×tan θ, for example. The angle of incidence θ, which is controlled by the reflective spatial light modulator 203 in this embodiment, may also be controlled by regulating the 4f optical system 241 so as to adjust its reduction ratio. The maximum value of angle of incidence θ is a critical angle of incidence due to the angle of view of the condenser optical system 204.

Figure 11:
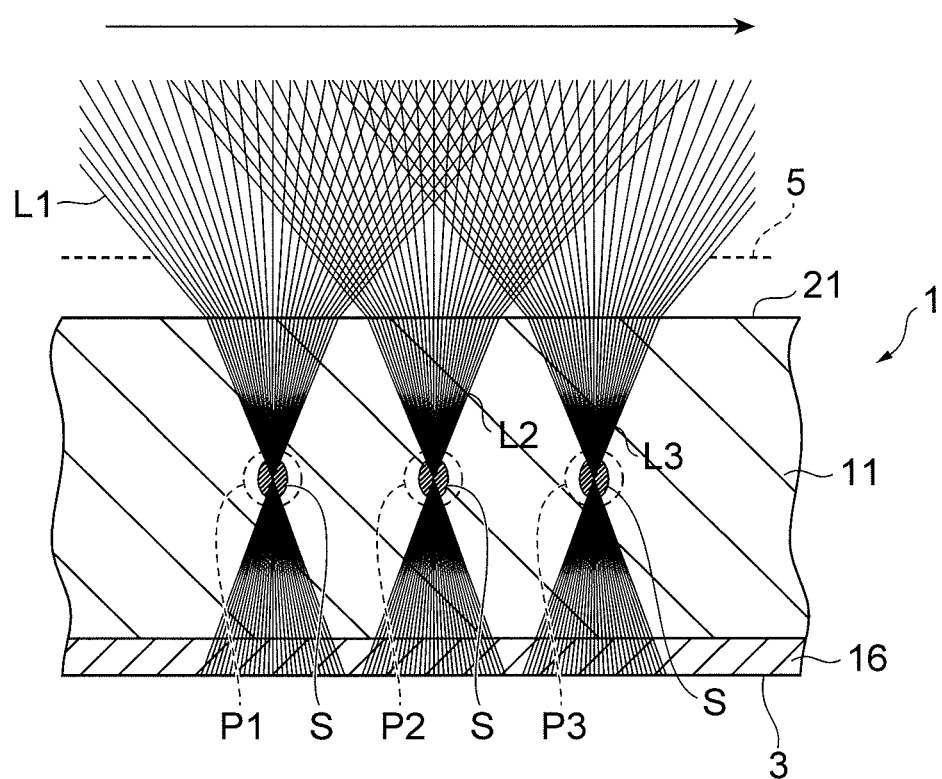
FIG. 11 is an enlarged sectional view of the object at which a plurality of laser lights are simultaneously converged by the laser processing apparatus of FIG. 8.

FIG. 11 is an enlarged sectional view of the object at which a plurality of laser lights are simultaneously converged by the laser processing apparatus of FIG. 8. In this drawing, the laser lights L1 to L3 are relatively moved from the left side to the right side. With respect to the moving direction of the laser lights L1 to L3, the simultaneous converging position P1 is the least advanced converging position, the simultaneous converging position P3 is the most advanced converging position, and the simultaneous converging position P2 is a converging position located in the middle of the gap between the simultaneous converging positions P1, P3. For convenience, the simultaneous converging positions P1 to P3 are indicated by circles (the same in FIGS. 12 to 15 and 17 which will follow).

As illustrated in FIG. 11, the interval H between the simultaneous converging positions P1 to P3 in this embodiment is such a distance that the simultaneously converged laser lights L1 to L3 are separated from each other so as to be kept from being superposed on each other on at least one of the front face 3 side (the side opposite from the laser light irradiation surface) and the rear face 21 side (irradiation surface side). Here, the interval H is a product of [the interval B] and [a predetermined number other than integral multiples of divisors (excluding 1; the same in the following) of the simultaneous convergence number N]. By "the lights L1 to L3 are kept from being superposed on each other" is meant that the lights L1 to L3 are not substantially superposed on each other. That is, even when the light components L1 to L3 are partly superposed on each other, they are not meant to be substantially superposed on each other if the energy density of the superposed laser light is not higher than a predetermined intensity which deteriorates the object 1.

In this embodiment, in view of the foregoing, the interval H is [4×interval B], and when the laser light L having a repetition frequency of a kHz is used, the scan speed is [simultaneous convergence number N/4/repetition frequency α×interval H]. In one example, the interval H is 40 μm, the repetition frequency is 10 kHz, the interval B is 10 μm, and the scan speed is 300 mm/s. In another example, the interval H is 24 μm, the repetition frequency is 15 kHz, the interval B is 6 μm, and the scan speed is 270 mm/s.

Figure 12:
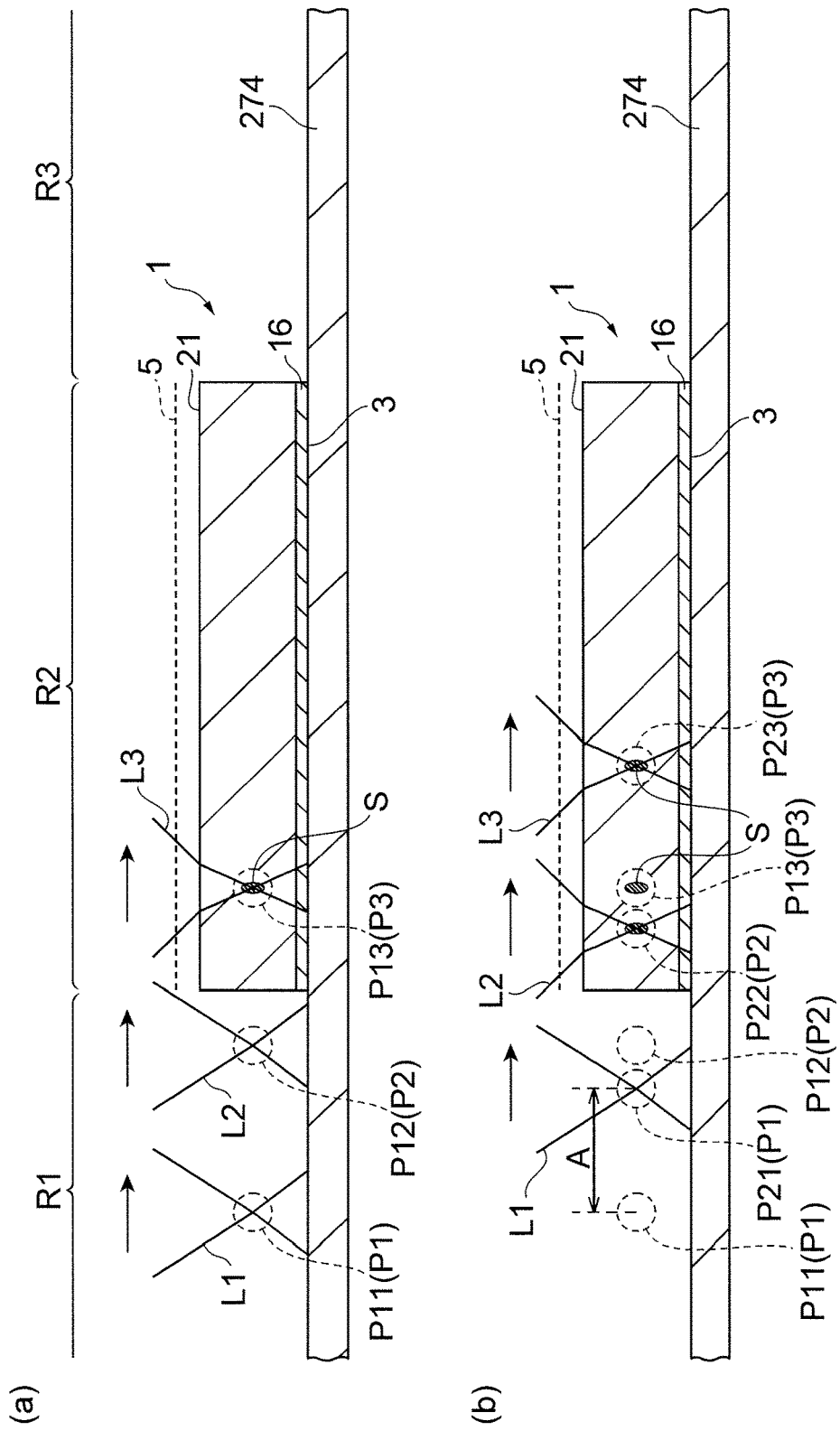
FIG. 12 (a) is a process drawing for explaining the laser processing in the embodiment, while (b) is a process drawing illustrating a sequel to FIG. 12(a)
Figure 13:
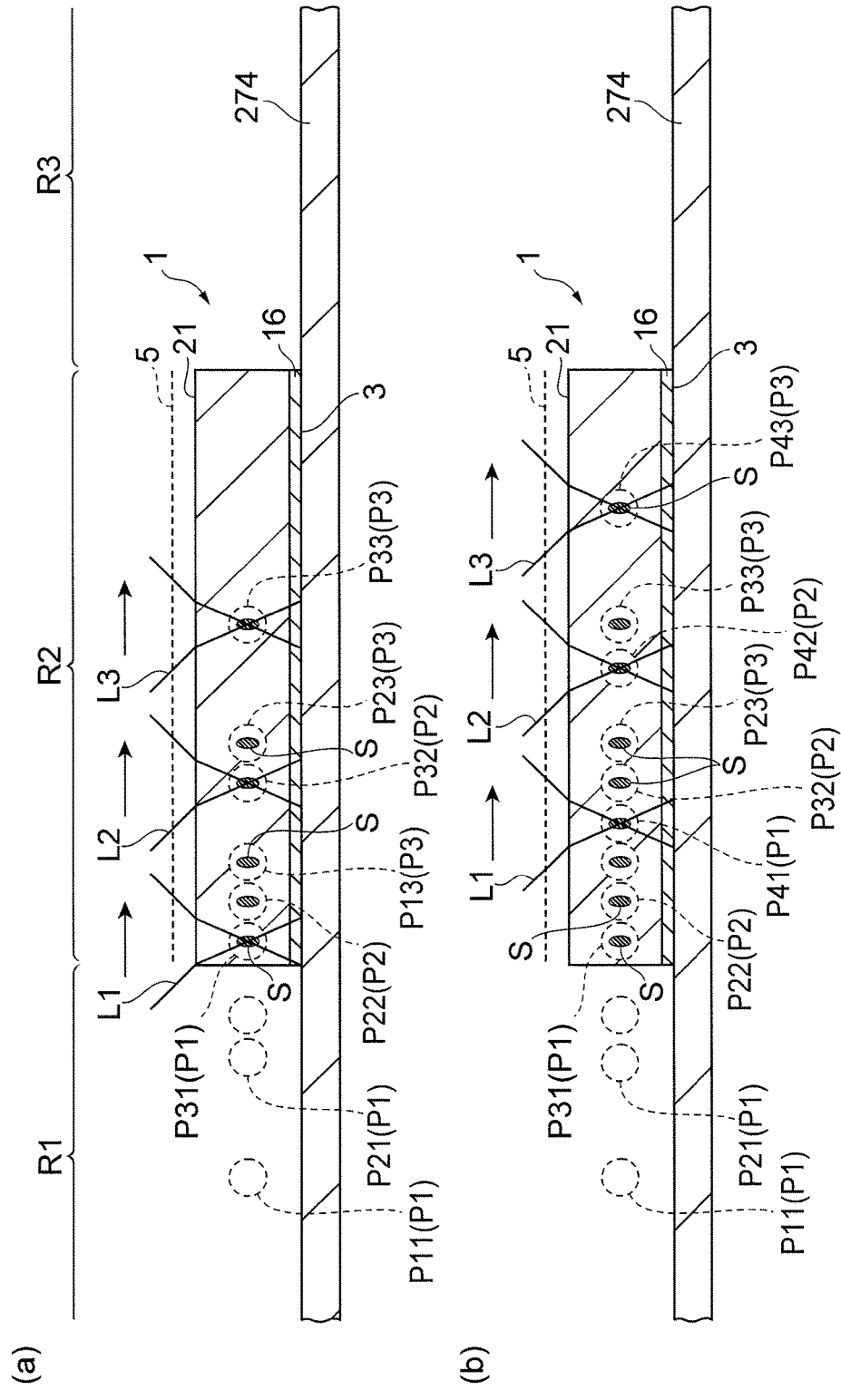
FIG. 13 (a) is a process drawing illustrating a sequel to FIG. 12(b), while (b) is a process drawing illustrating a sequel to FIG. 13(a)
Figure 14:
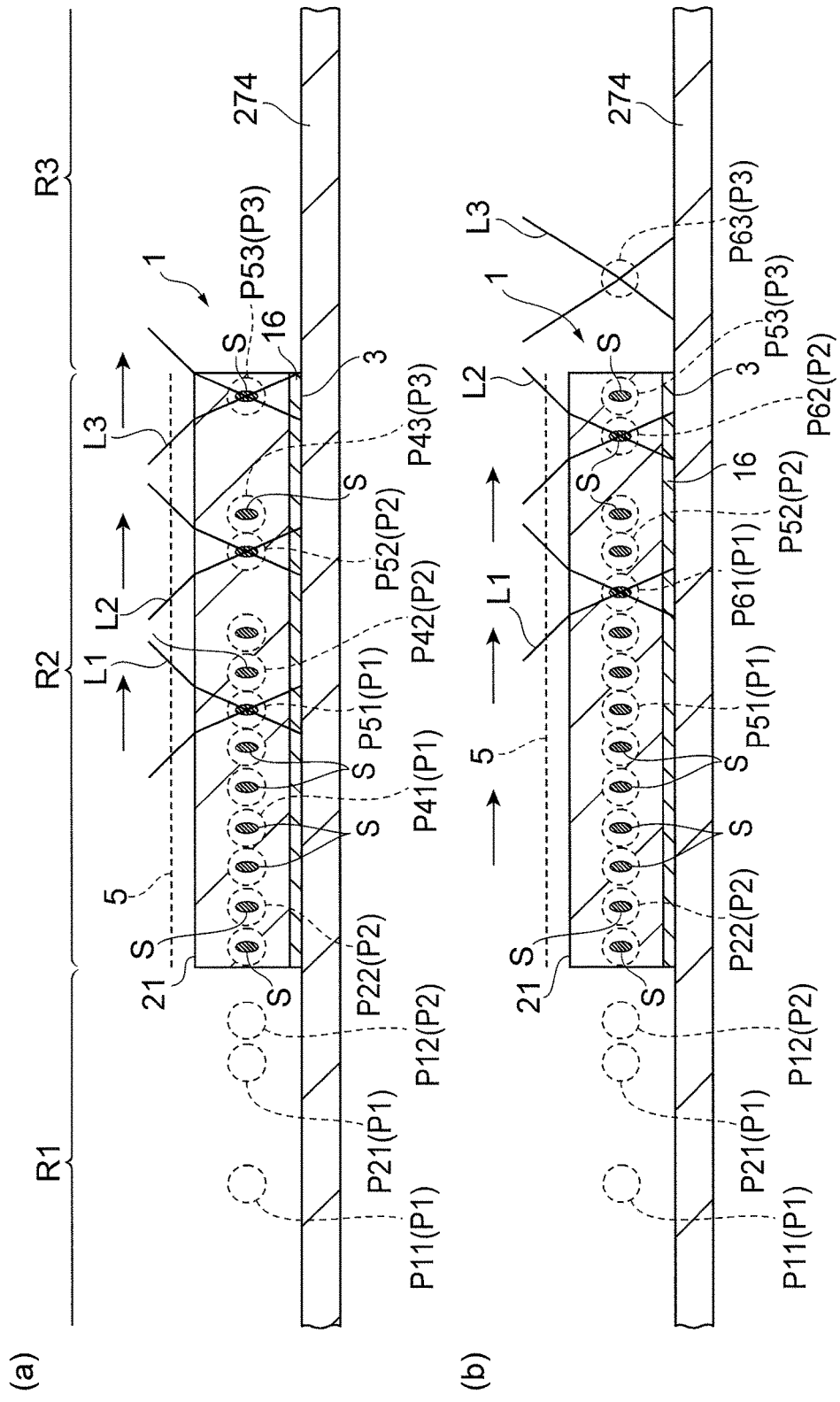
FIG. 14 (a) is a process drawing illustrating a sequel to FIG. 13(b), while (b) is a process drawing illustrating a sequel to FIG. 14(a)

Subsequently, as illustrated in FIGS. 12 to 14, the object 1 is irradiated with the laser lights L1 to L3 in a pulsating manner, which are relatively moved one-directionally along the line to cut 5 from an outer region R1 of the object 1 to an outer region R3 thereof through an inner region R2 thereof, so as to perform the converging step repeatedly. Here, at least one of the simultaneous converging positions P1 to P3 in the converging step in a later stage is located between the simultaneous converging positions P1 to P3 in the converging step in an earlier stage. Specifically, the simultaneous converging positions P1 to P3 in the converging step in the later stage are located ahead of the simultaneous converging positions P1 to P3 in the converging step in the earlier stage, respectively, while the converging positions P1 and P2 in the converging step in the later stage do not exceed the converging positions P2 and P3 in the converging step in the earlier stage, respectively.

More specifically, as illustrated in FIG. 12(a), pulsed irradiation is started while relatively moving the laser lights L1 to L3 along the line to cut 5, so as to converge the laser lights L1 to L3 simultaneously at simultaneous converging positions P11 to P13, thereby forming modified spots S at the same time. Here, the simultaneous converging positions P11, P12 are located in the outer region R1, whereas the simultaneous converging position P13 is located in the inner region R2 ahead of an outer edge E of the object 1 by a predetermined length in the moving direction.

At this time, while an expandable tape 274 is directly irradiated with the laser lights L1, L2 as mentioned above, laser light not transmitted through the object 1 is likely to expand and yield a relatively low energy density, whereby the expandable tape 274 is hardly deteriorated by the laser lights L1, L2.

Subsequently, as illustrated in FIG. 12(b), the laser lights L1 to L3 are emitted in a pulsating manner while being relatively moved along the line to cut 5, so as to be converged at simultaneous converging positions P21 to P23. This forms two modified spots S at the simultaneous converging positions P22, P23 at the same time.

The distance A between the simultaneous converging positions P11, P21 (P12, P22 or P13, P23), which is determined by the repetition frequency of laser and the scan speed or processing speed, is interval B×simultaneous convergence number N. The simultaneous converging position P21 is located closely behind the simultaneous converging position P12 in the moving direction between the simultaneous converging positions P11, P12 in the outer region R1. The simultaneous converging position P22 is located closely behind the simultaneous converging position P13 in the moving direction between the simultaneous converging positions P12, P13 in the inner region R2. The simultaneous converging position P23 is located ahead of the simultaneous converging position P13 in the moving direction in the inner region R2.

Similarly, as illustrated in FIGS. 13(a) to 14(b), the laser lights L1 to L3 are kept being emitted in a pulsating manner while being relatively moved along the line to cut 5, so as to be simultaneously converged at simultaneous converging positions P31 to P33, P41 to P43, P51 to P53, and P61 to P63 in sequence, so that a plurality of modified spots S are formed without being superposed on each other.

Then, as illustrated in FIG. 15, the laser lights L1 to L3 are kept being emitted in a pulsating manner while being relatively moved along the line to cut 5, so as to be simultaneously converged at simultaneous converging positions P71 to P73, thus forming a modified spot S at the simultaneous converging position P71. This forms a plurality of modified spots S from one end to the other end along the line to cut 5 within the object 1 at equally spaced intervals closely to each other without being superposed on each other, and these modified spots S produce the modified region 7.

As in the foregoing, this embodiment simultaneously converges the laser lights L1 to L3 at the simultaneous converging positions separated from each other along the line to cut 5 and thus can make the takt time shorter than in the conventional laser processing. In addition, since the simultaneous converging positions P1, P2 in the converging step in the later stage are located between the simultaneous converging positions P1, P2 and between the simultaneous converging positions P2, P3 in the converging step in the earlier stage, respectively, the modified spots S can finally be formed densely in the object 1 along the line to cut 5. At this time, the converging positions P in the repeated converging steps (i.e., finally converged converging positions P) are not superposed on each other, so that irradiation of existing modified spots S with the laser lights L1 to L3 (so-called overstriking with the laser lights L1 to L3) can be prevented from occurring. This can avoid idleness in the takt time and inhibit the modified spots S from becoming uselessly large and adversely affecting the forming of the modified region 7. Therefore, this embodiment can shorten the takt time in laser processing and form the modified region 7 accurately.

Further, as mentioned above, the simultaneous converging positions P1 to P3 are separated from each other so that the laser lights L1 to L3 are kept from being superposed on each other on at least one of the front face 3 side and rear face 21 side of the object 1, which can inhibit the laser lights L1 to L3 from being superposed on each other on the front face 3 side (e.g., the GaN layer 16) of the object 1 and thereby unintentionally enhancing the beam intensity. This can prevent the object 1 (the front face 3 side of the object 1 in particular) and, in turn, the GaN layer 16 from deteriorating.

Since there is a range suitable for cutting in the interval B between the modified spots S, the cutting may become harder or lower its accuracy if the interval H between the simultaneous converging positions P1 to P3 is too wide. Locating the simultaneous converging positions P1, P2 in the converging step in the later stage between the simultaneous converging positions P1, P2 and between the simultaneous converging positions P2, P3 in the converging step in the earlier stage, respectively, as in this embodiment, by contrast, can inhibit the plurality of modified spots S finally formed in the object 1 from being separated too much from each other (can arrange the modified spots S as if the modified region 7 is formed without expanding the interval H), whereby the modified region 7 can be formed accurately.

On the front face 3 side, which is the side opposite from the laser light irradiation surface, the laser lights L1 to L3 expand and thus are likely to be superposed on each other and interfere with each other, thereby yielding a higher energy density. When the sapphire substrate 11 having high light transmittance is used for the object 1 as in this embodiment, the laser lights L1 to L3 are likely to pass through the object 1 without being absorbed thereby, so that the energy density on the front face 3 side is likely to become higher from this point as well. Hence, the above-mentioned operational effect of preventing the laser lights L1 to L3 from being superposed on each other and avoiding deterioration is effective in particular in this embodiment.

Since the modified spots S are formed equidistantly along the line to cut 5 in the object 1 as mentioned above, the object 1 can be cut accurately along the line to cut 5 in this embodiment.

Figure 17:
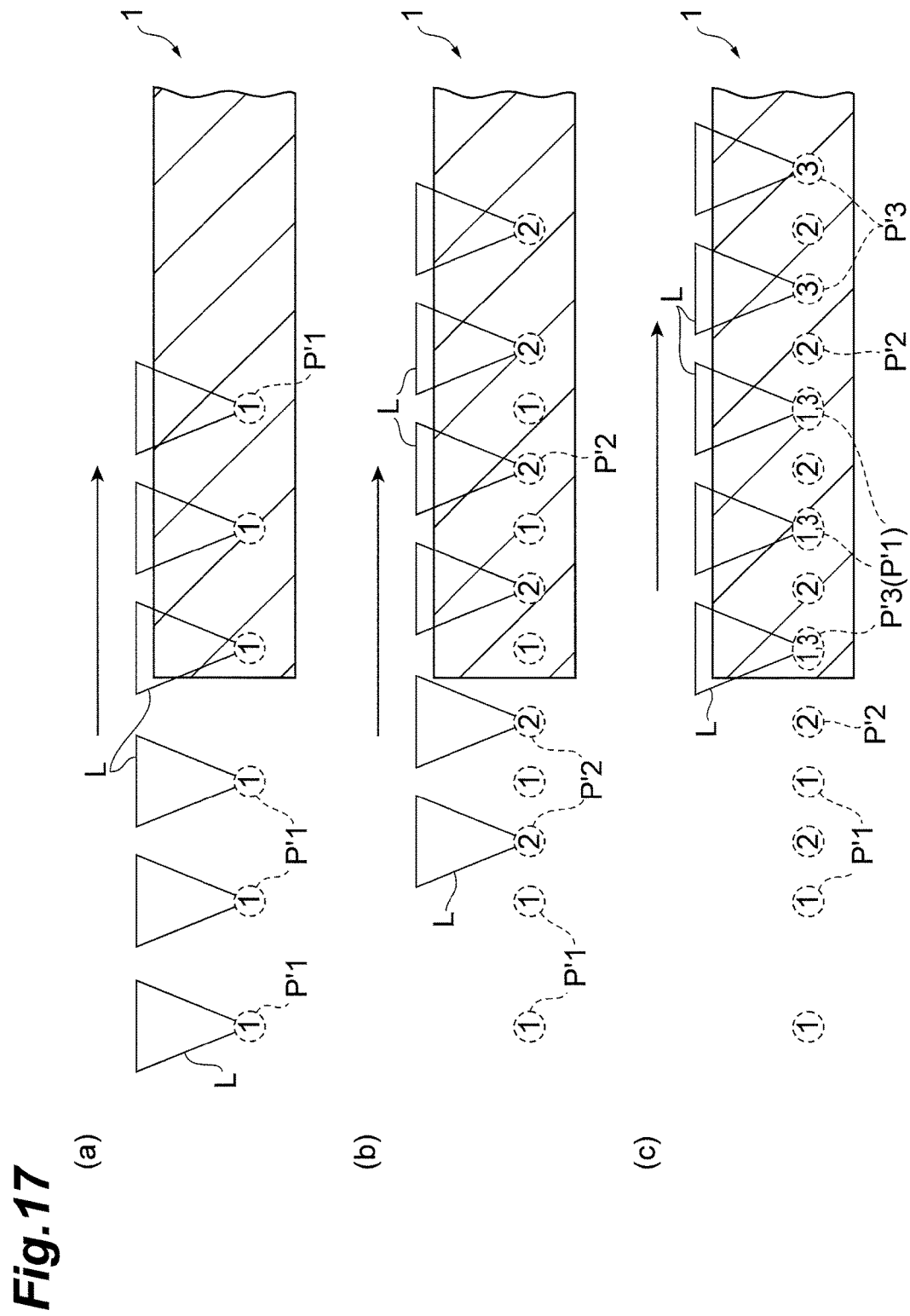
FIG. 17 (a) is a process drawing of laser processing for explaining the relationship between the number of simultaneous convergences and the interval between simultaneous converging positions, (b) is a process drawing illustrating a sequel to FIG. 17(a), and (c) is a process drawing illustrating a sequel to FIG. 17(b)

FIG. 16 is chart illustrating the relationship between the number of simultaneous convergences and the interval between simultaneous converging positions, FIG. 17(a) is a schematic process drawing of laser processing for explaining the relationship between the number of simultaneous convergences and the interval between simultaneous converging positions, FIG. 17(b) is a schematic process drawing illustrating a sequel to FIG. 17(a), and FIG. 17(c) is a schematic process drawing illustrating a sequel to FIG. 17(b). In FIG. 16, "NG" means that, in its corresponding processing condition of row and column in the chart, at least one of the simultaneous converging positions in the converging step in the earlier stage overlaps any of the simultaneous converging positions in the converging step in the later stage, thereby making it unsuitable for forming the modified region 7. The interval H between simultaneous converging positions, which is set on the basis of the interval B as mentioned above, is represented by a value based on the interval B (a value divided by the interval B) in FIG. 16. The numbers attached to the simultaneous converging positions P'1 to P'3 in FIG. 17 represent the order of convergences.

When the interval H is any of predetermined numbers other than integral multiples of divisors of the simultaneous convergence numbers N, the modified spots S can accurately be formed at equally spaced intervals without becoming "NG" as illustrated in FIG. 16. On the other hand, it is seen that "NG" occurs when the interval H is any of integral multiples of divisors of the simultaneous convergence numbers N. As illustrated in FIG. 16, it is seen that, for example, when the simultaneous convergence number and the interval H between simultaneous converging positions are 6 and 4, respectively (the processing condition within a bold frame), the simultaneous converging position P'1 in the earlier stage and the simultaneous converging position P'3 in the later stage overlap each other, whereby the modified spots S cannot be formed accurately.

In this regard, the interval H between the simultaneous converging positions P1 to P3 is a product of the interval B between the modified spots S and a predetermined number other than integral multiples of divisors of the simultaneous convergence numbers N in this embodiment as mentioned above. This can favorably prevent the simultaneous converging positions P1 to P3 in the converging steps in the earlier and later stages from overlapping, while forming the modified spots S at equally spaced intervals along the line to cut 5 in the object 1.

As mentioned above, this embodiment relatively moves the laser lights L1 to L3 in one direction along the line to cut 5 from the outer region R1 to the outer region R3 through the inner region R2 of the object 1, while repeating the converging step. Here, as illustrated in FIG. 15, the simultaneous converging positions P at which the laser lights L1 to L3 are finally converged are hard to place equidistantly on the converging step start side 401 and converging step end side 402 even by repeating the converging step. By contrast, when laser lights L1 to L3 are relatively moved from the region R1 to the region R3 so as to place the simultaneous converging position P on the converging step start side 401 or converging step end side 402 in the outer region R1 or R3 of the object 1 as in this embodiment, only the equidistantly arranged plurality of converging positions P can be placed in the inner region R2. As a result, the modified spots S can accurately be formed in the object 1 at equally spaced intervals.

Figure 18:
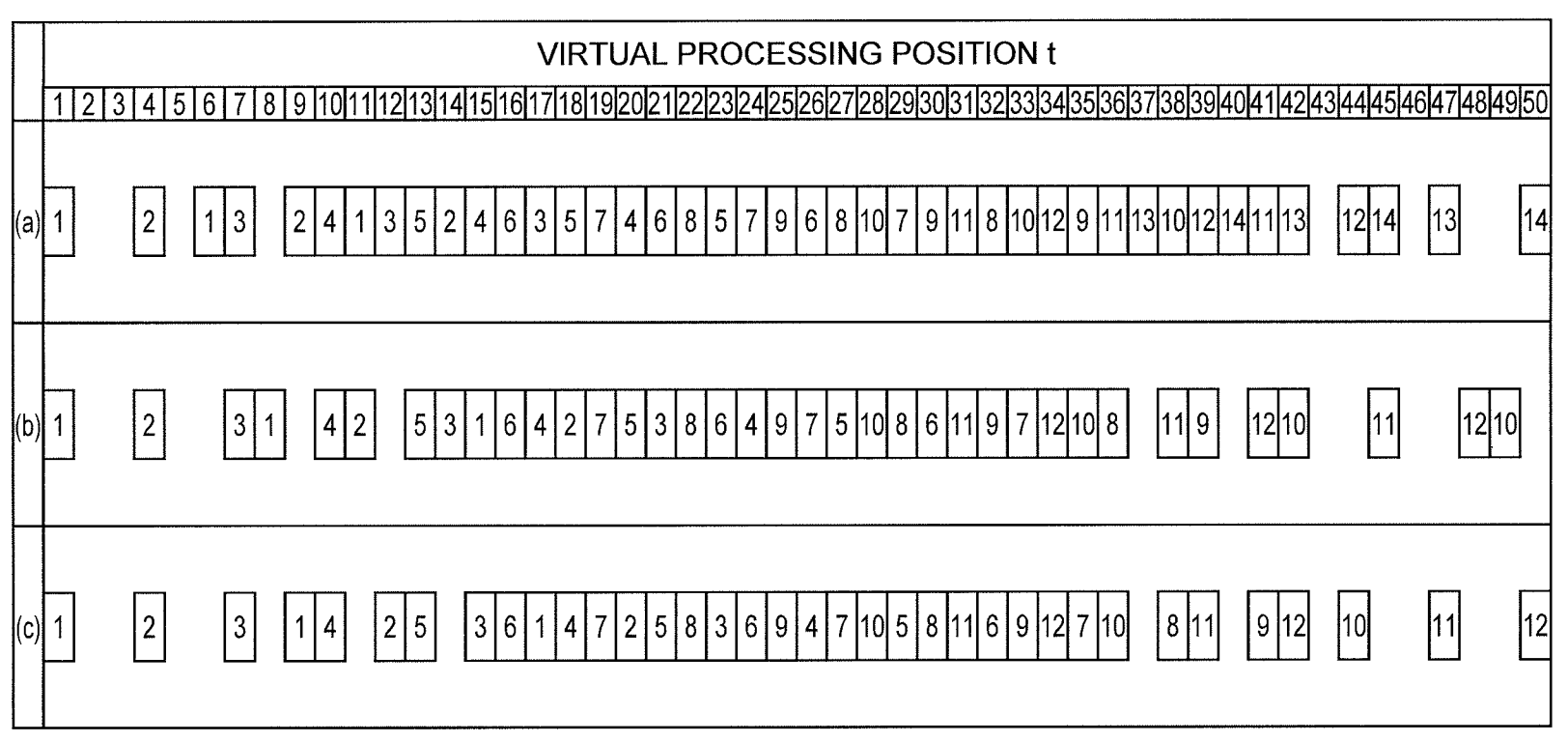

FIG. 18 is a diagram illustrating simultaneous converging positions and orders of convergences in an embodiment in accordance with another example. FIG. 18 shows virtual processing positions t along a line to cut in the horizontal direction, while the virtual processing positions t are represented on the basis of the interval B between modified spots S. The numbered cells mean that their virtual processing positions t are taken as simultaneous converging positions, while their numbers indicate the orders of processing. The laser lights L1 to L3 are moved from the left side to right side of the drawing sheet. This is the same in FIGS. 19 and 20.

As illustrated in FIG. 17, the interval H between the simultaneous converging positions P1 to P3 is not restricted by this embodiment, but may be any value as long as the laser lights L1 to L3 are separated from each other so as to be kept from being superposed on each other on the side opposite from the laser light irradiation surface of the object 1. While the overlap of the laser lights L1 to L3 is further suppressed when the interval H is wider, the spatial frequency becomes higher, thereby making it harder to express (display) the modulation pattern in the reflective spatial light modulator 203. Narrowing the interval H, on the other hand, is advantageous in expressing (displaying) the modulation pattern in the reflective spatial light modulator 203, since the spatial frequency is lower, but enhances the overlap of the laser lights L1 to L3.

The positional relationship of the simultaneous converging positions P1 to P3 in the converging steps in the earlier and later stages is not restricted by this embodiment but may be any of various positional relationships as long as at least one of the simultaneous converging positions P1 to P3 is located between the simultaneous converging positions P1 to P3 in the converging step in the earlier stage. For example, as illustrated in FIG. 18(a), the interval H may be 5, so that the simultaneous converging positions in the converging step in the later stage are located on the front side of their corresponding centers between the simultaneous converging positions in the converging step in the earlier stage.

As illustrated in FIGS. 18(b) and 18(c), the interval H may be 7 and 8, respectively, so that the simultaneous converging positions in the converging step in the second stage are located between the simultaneous converging positions in the converging step in the first stage, and the simultaneous converging positions in the converging step in the third stage are located not only between the simultaneous converging positions in the converging step in the first stage but also between the simultaneous converging positions in the converging step in the second stage. It is seen that the modified spots S can be formed at equally spaced intervals in the object 1 in these cases as well.

Here, in the case of wide-interval simultaneous laser processing of a type in which the interval H is [simultaneous convergence number N+1], the convergence order $j_{N+1}$ can be represented by the following expression (1). In the case of wide-interval simultaneous laser processing of a type in which the interval H is [simultaneous convergence number N−1], the convergence order $j_{N-1}$ can be represented by the following expression (2).

$$j_{N+1} = \text{ROUNDUP}(t/N) - \text{REMAINDER}(t-1,N) \quad (1)$$

$$j_{N-1} = \text{ROUNDUP}(t/N) + \text{REMAINDER}(\text{REMAINDER}(t-1,N),-N+1) \quad (2)$$

where t is the virtual processing position, and N is the simultaneous convergence number.

Figure 19:
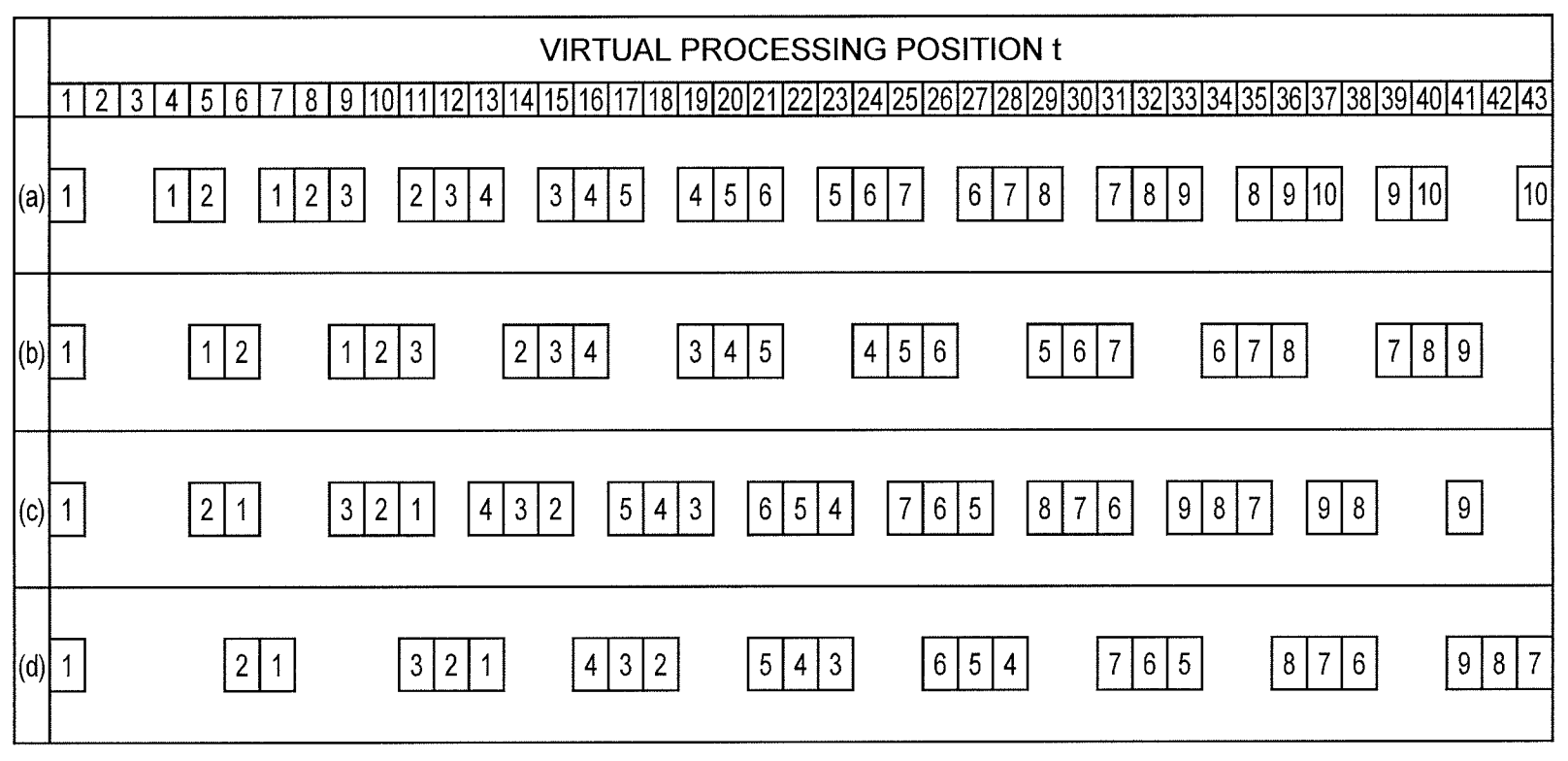

Though preferred embodiments of the present invention have been explained in the foregoing, the present invention is not limited thereto. For example, in the present invention, the laser lights L1 to L3 converged at the simultaneous converging positions may have any energy values, and the energy of at least one of them may be set to zero or cut down. This can construct simultaneous converging positions with gaps at predetermined intervals (at unequally spaced intervals) along the line to cut 5 as illustrated in FIG. 19, for example. Such an irradiation method can be used when forming a gap at an intersection of lines to cut 5 intersecting each other, for example.

Figure 20:
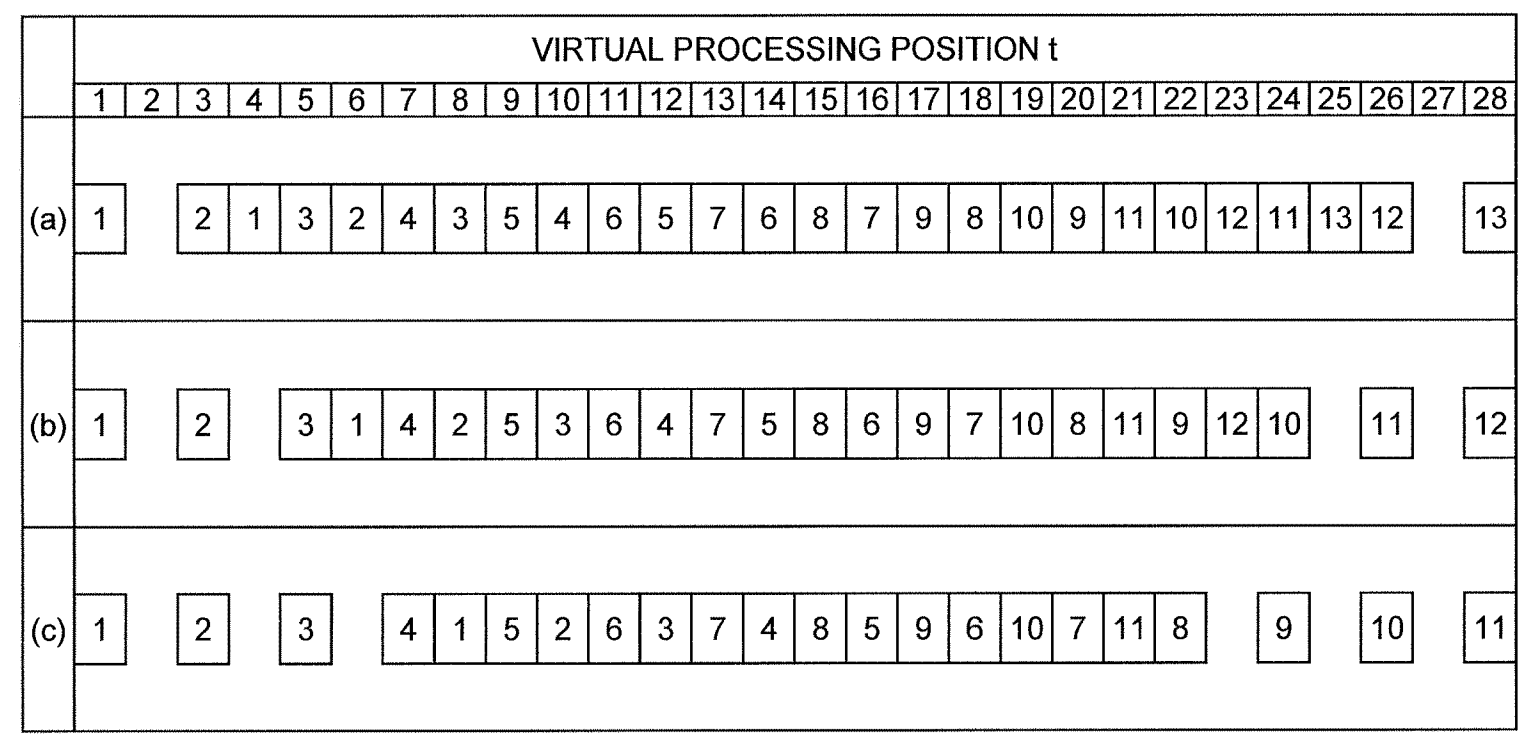

The simultaneous convergence number N, which is 3 in the above-mentioned embodiments, is at least 2 and may be 2 as illustrated in FIG. 20. The laser light entrance surface at the time of forming the modified region 7 is not limited to the rear face 21 of the object 1, but may be the front face 3 of the object 1.

Though the LCOS-LM is employed as the reflective spatial light modulator 203 in the above-mentioned embodiments, MEMS-SLM, DMD (deformable mirror device), or the like may also be used. While the above-mentioned embodiments use the reflective spatial light modulator 203, it may be a transmissive spatial light modulator. Examples of the spatial light modulator include those of liquid crystal cell and LCD types.

The present invention is not limited to irradiation with a plurality of laser lights by using the reflective spatial light modulator 203 as long as at least a plurality of laser lights can be converged simultaneously at a plurality of simultaneous converging positions separated from each other along the line to cut. A plurality of simultaneous converging positions may be separated from each other in the thickness direction of the object 1.

Though the reflective spatial light modulator 203 in the above-mentioned embodiments is equipped with a dielectric multilayer film mirror, reflections of pixel electrodes of the silicon substrate may be utilized. The 4f optical system 241, which is used in the above-mentioned embodiments, may be omitted when the change in wavefront forms is unproblematic.

INDUSTRIAL APPLICABILITY

The present invention can shorten the takt time in laser processing and accurately form the modified region.

REFERENCE SIGNS LIST

1 . . . object to be processed; 3 . . . front face (opposite surface); 5 . . . line to cut; 7 . . . modified region; 21 . . . rear face (laser light irradiation surface); B . . . modified spot interval; H . . . simultaneous converging position interval (interval between a plurality of converging positions); L1 to L3 . . . laser lights; N . . . simultaneous convergence number (number of converging positions); P1 to P3, P'1 to P'3, P11 to P13, P21 to P23, P31 to P33, P41 to P43, P51 to P53, P61 to P63, P71 to P73 . . . simultaneous converging positions (converging positions); S . . . modified spot

The invention claimed is:

1. A laser processing method for converging a plurality of laser lights at an object to be processed to form a modified region in the object along a line to cut, the method comprising:

a converging step of simultaneously converging a plurality of laser lights at a plurality of converging positions separated from each other along the line to cut; and a forming step of relatively moving the plurality of laser lights along the line to cut while repeating the converging step to generate one or more repeated converging steps, to form a plurality of modified spots along the line to cut and cause the plurality of modified spots to form the modified region;

an irradiating step on the line to cut, comprising:
 (i) causing the plurality of modified spots to be formed simultaneously by an (n)th laser light irradiation;
 (ii) simultaneously causing, by an (n+1)th laser light irradiation, one modified spot to be formed in a region between a pair of modified spots that are formed simultaneously by the (n)th laser light irradiation, and a modified spot to be formed at a position outside an outermost modified spot among the plurality of modified spots that are formed simultaneously by the (n)th laser light irradiation;
 (iii) increasing (n) by one to repeat the process of (ii);
wherein the plurality of converging positions in the one or more repeated converging steps are kept from being superposed on each other; and
wherein at least one of the plurality of converging positions along the line to cut in a later stage is located between at least two of the plurality of converging positions along the line to cut in an earlier stage that immediately precedes the later stage.

2. A laser processing method according to claim 1, wherein the plurality of modified spots are formed equidistantly along the line to cut.

3. A laser processing method according to claim 2, wherein the plurality of converging positions in the converging step span an interval H, the interval H being a length given by a product of a separation interval for each of the plurality of modified spots and a predetermined number other than an integral multiple of a divisor of a number N of the plurality of converging positions, wherein the divisor is not unity.

4. A laser processing method according to claim 2, wherein, in the forming step, the plurality of laser lights are relatively moved from outside to inside or from inside to outside of the object in a direction along the line to cut while repeating the converging step.

5. A laser processing method according to claim 3, wherein, in the forming step, the plurality of laser lights are relatively moved from outside to inside or from inside to outside of the object in a direction along the line to cut while repeating the converging step.

6. A laser processing method according to claim 1, wherein the plurality of laser lights are simultaneously converged to be separated from each other and kept from being superposed on each other on at least one of a front face and a rear face of the object, and
wherein an energy density in the front face or rear face is less than a predetermined intensity which deteriorates the object.

* * * * *